United States Patent
Li

(10) Patent No.: US 10,423,508 B2
(45) Date of Patent: Sep. 24, 2019

(54) METHOD AND SYSTEM FOR A HIGH-PRIORITY READ BASED ON AN IN-PLACE SUSPEND/RESUME WRITE

(71) Applicant: Alibaba Group Holding Limited, George Town, Grand Cayman (KY)

(72) Inventor: Shu Li, Bothell, WA (US)

(73) Assignee: Alibaba Group Holding Limited, George Town (KY)

( * ) Notice: Subject to any disclaimer, the term of this patent is extended or adjusted under 35 U.S.C. 154(b) by 0 days.

(21) Appl. No.: 15/675,447

(22) Filed: Aug. 11, 2017

(65) Prior Publication Data

US 2019/0050312 A1 Feb. 14, 2019

(51) Int. Cl.

| G06F 12/00 | (2006.01) |
|---|---|
| G06F 11/28 | (2006.01) |
| G06F 3/06 | (2006.01) |
| G11C 16/10 | (2006.01) |
| G06F 12/02 | (2006.01) |
| G06F 11/08 | (2006.01) |
| G06F 11/10 | (2006.01) |

(52) U.S. Cl.
CPC ............ *G06F 11/28* (2013.01); *G06F 3/0679* (2013.01); *G06F 11/08* (2013.01); *G06F 11/1004* (2013.01); *G06F 11/1044* (2013.01); *G06F 12/0246* (2013.01); *G06F 12/0253* (2013.01); *G11C 16/105* (2013.01); *G06F 2212/7202* (2013.01)

(58) Field of Classification Search
CPC .. G06F 11/08; G06F 11/1004; G06F 11/1044; G06F 11/28; G06F 3/0679; G06F 12/0246; G06F 12/0253; G06F 2212/7202; G11C 16/105
See application file for complete search history.

(56) References Cited

U.S. PATENT DOCUMENTS

| 4,775,932 A | 10/1988 | Oxley |
|---|---|---|
| 6,226,650 B1 | 5/2001 | Mahajan et al. |
| 7,565,454 B2 | 7/2009 | Zuberi |
| 8,260,924 B2 | 9/2012 | Koretz |

(Continued)

FOREIGN PATENT DOCUMENTS

| JP | 2003022209 | 1/2003 |
|---|---|---|
| JP | 2011175422 | 9/2011 |
| WO | 1994018634 | 8/1994 |

OTHER PUBLICATIONS https://web.archive.org/web/20071130235034/http://en.wikipedia.org:80/wiki/logical_block_addressing wikipedia screen shot retriefed on wayback Nov. 20, 2007 showing both physical and logical addressing used historically to access data on storage devices (Year: 2007).

*Primary Examiner* — Shawn X Gu

(74) *Attorney, Agent, or Firm* — Shun Yao; Park, Vaughan, Fleming & Dowler LLP

(57) ABSTRACT

One embodiment facilitates a high-priority read. During operation, the system receives, by a controller module of a storage device, a first request to write first data to a non-volatile memory of the storage device. The system commences a write operation to write the first data to the non-volatile memory. In response to detecting a second request to read second data from the non-volatile memory, the system: suspends the write operation; reads the second data from the non-volatile memory; and resumes the suspended write operation.

20 Claims, 12 Drawing Sheets

(56) References Cited

U.S. PATENT DOCUMENTS

| | | |
|---|---|---|
| 8,452,819 B1 | 5/2013 | Sorenson, III |
| 8,516,284 B2 | 8/2013 | Chan |
| 9,092,223 B1 | 7/2015 | Pani |
| 2002/0010783 A1 | 1/2002 | Primak |
| 2002/0161890 A1 | 10/2002 | Chen |
| 2004/0010545 A1 | 1/2004 | Pandya |
| 2004/0255171 A1 | 12/2004 | Zimmer |
| 2004/0268278 A1 | 12/2004 | Hoberman |
| 2005/0038954 A1* | 2/2005 | Saliba ............... G06F 3/0607 711/100 |
| 2005/0097126 A1 | 5/2005 | Cabrera |
| 2005/0177755 A1 | 8/2005 | Fung |
| 2005/0235171 A1 | 10/2005 | Igari |
| 2006/0156012 A1 | 7/2006 | Beeson |
| 2007/0033323 A1 | 2/2007 | Gorobets |
| 2009/0282275 A1 | 11/2009 | Yermalayeu |
| 2010/0229224 A1 | 9/2010 | Etchegoyen |
| 2010/0325367 A1 | 12/2010 | Kornegay |
| 2011/0055458 A1 | 3/2011 | Kuehne |
| 2011/0153903 A1 | 6/2011 | Hinkle |
| 2011/0231598 A1 | 9/2011 | Hatsuda |
| 2011/0292538 A1 | 12/2011 | Haga |
| 2011/0302353 A1 | 12/2011 | Confalonieri |
| 2012/0117399 A1 | 5/2012 | Chan |
| 2012/0246392 A1 | 9/2012 | Cheon |
| 2013/0073798 A1* | 3/2013 | Kang ............... G06F 12/0246 711/103 |
| 2013/0145085 A1 | 6/2013 | Yu |
| 2013/0145089 A1 | 6/2013 | Eleftheriou |
| 2013/0159251 A1 | 6/2013 | Skrenta |
| 2013/0166820 A1 | 6/2013 | Batwara |
| 2013/0173845 A1 | 7/2013 | Aslam |
| 2013/0318283 A1 | 11/2013 | Small |
| 2014/0233950 A1 | 8/2014 | Luo |
| 2014/0250259 A1 | 9/2014 | Ke |
| 2014/0310574 A1 | 10/2014 | Yu |
| 2014/0359229 A1 | 12/2014 | Cota-Robles |
| 2014/0365707 A1 | 12/2014 | Talagala |
| 2015/0082317 A1 | 3/2015 | You |
| 2015/0106556 A1 | 4/2015 | Yu |
| 2015/0142752 A1 | 5/2015 | Chennamsetty |
| 2015/0372597 A1 | 12/2015 | Luo |
| 2016/0098344 A1 | 4/2016 | Gorobets |
| 2016/0110254 A1 | 4/2016 | Cronie |
| 2016/0232103 A1 | 8/2016 | Schmisseur |
| 2016/0239074 A1 | 8/2016 | Lee |
| 2016/0239380 A1 | 8/2016 | Wideman |
| 2016/0343429 A1 | 11/2016 | Nieuwejaar |
| 2016/0350002 A1 | 12/2016 | Vergis |
| 2017/0168986 A1 | 6/2017 | Sajeepa |
| 2017/0212708 A1* | 7/2017 | Suhas ............... G06F 3/0652 |
| 2017/0353576 A1 | 12/2017 | Guim Bernat |
| 2018/0024772 A1* | 1/2018 | Madraswala ......... G06F 3/0659 711/103 |
| 2018/0088867 A1 | 3/2018 | Kaminaga |

\* cited by examiner

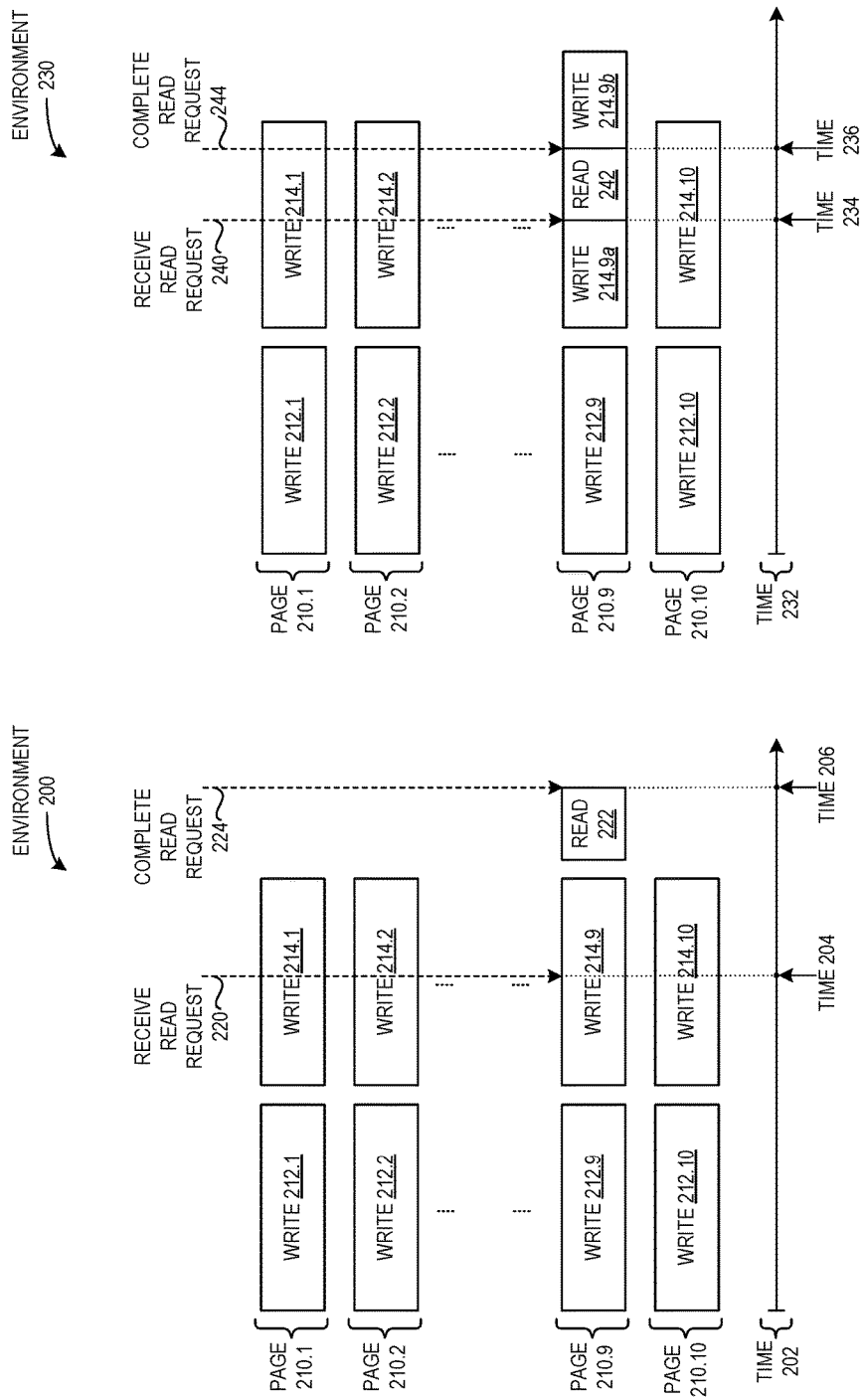

METHOD AND SYSTEM FOR A HIGH-PRIORITY READ BASED ON AN IN-PLACE SUSPEND/RESUME WRITE

BACKGROUND

Field

This disclosure is generally related to the field of data storage. More specifically, this disclosure is related to a method and system for a high-priority read based on an in-place suspend/resume write.

Related Art

The proliferation of the Internet and e-commerce continues to create a vast amount of digital content. Various storage systems have been created to access and store such digital content. In a standard storage system, a server may store data in a non-volatile memory, such as NAND flash component. A NAND flash typically includes multiple dies, where a single die can include a hierarchy of multiple plane, blocks, and pages. Data is written to and read from a page-level unit. A typical write operation to a NAND page can occupy an entire page buffer of the involved NAND die. As a result, a read request (e.g., a read operation) received during an ongoing write operation cannot begin or complete until the ongoing write operation is completed. That is, if a read operation is requested for the same die on which a write operation is currently being performed, the read operation must wait until the write operation is completed. Thus, the latency involved in performing the read operation on the die is dependent on completion of an ongoing write operation on the same NAND die.

Writing data to a page may require approximately several milliseconds, while reading data from a page may require only hundreds of microseconds. Thus, a read operation results in a higher latency from a delayed start in waiting for completion of an ongoing write operation, where the delay may be on the order of milliseconds. Given both the increasing density of current NAND dies and the decreasing size of computer components in general, a read operation may result in a hit on the same NAND die on which an ongoing write operation is being performed, thus resulting in a higher latency. This higher latency can decrease the efficiency of a storage system.

SUMMARY

One embodiment facilitates a high-priority read. During operation, the system receives, by a controller module of a storage device, a first request to write first data to a non-volatile memory of the storage device. The system commences a write operation to write the first data to the non-volatile memory. In response to detecting a second request to read second data from the non-volatile memory, the system: suspends the write operation; reads the second data from the non-volatile memory; and resumes the suspended write operation.

In some embodiments, the system maps a logical block address of the first data to a first physical block address of the non-volatile memory, wherein the first physical block address is associated with a first page of the non-volatile memory.

In some embodiments, in response to detecting a first timeout based on a timestamp for the first data, the system maps the logical block address of the first data to a second physical block address of the non-volatile memory, wherein the second physical block address is associated with a second page of the non-volatile memory. The system marks the first page as available to be recycled. The system updates the timestamp for the first data, and writes the first data to the second page, wherein a second timeout is detected based on the updated timestamp for the first data.

In some embodiments, the system processes the first data by: encoding the first data based on a cyclic redundancy check; compressing the encoded data; encrypting the compressed data; encoding the encrypted data based on an error correction code (ECC); adjusting a format of the ECC-encoded data; and inserting a timestamp for the adjusted data.

In some embodiments, suspending the write operation is in response to detecting a completion of an ongoing verify procedure in an incremental step pulse program.

In some embodiments, subsequent to suspending the write operation, the system receives, by the controller, sensed data which includes data of the first data still to be written to the non-volatile memory, and stores the sensed data in a data buffer of the controller. Subsequent to resuming the suspended write operation, the system transmits, by the controller, the sensed data to the non-volatile memory.

In some embodiments, the non-volatile memory is a NAND flash memory which includes a plurality of dies, wherein a die includes a plurality of planes, wherein a plane includes a plurality of blocks, and wherein a block includes a plurality of pages. The non-volatile memory may only be accessed by a single read or write operation at a time.

Another embodiment facilitates a high-priority read. During operation, the system receives, by a controller module of a storage device, a request to read data stored in a non-volatile memory of the storage device. In response to determining that the non-volatile memory is performing an ongoing write operation, the system: suspends the ongoing write operation; reads the requested data from the non-volatile memory; and resumes the suspended write operation.

In some embodiments, subsequent to suspending the ongoing write operation, the system receives, by the controller, sensed data which includes data still to be written to the non-volatile memory, and stores the sensed data in a data buffer of the controller. Subsequent to resuming the suspended write operation, the system transmits, by the controller, the sensed data to the non-volatile memory.

In some embodiments, the system obtains a physical block address of the non-volatile memory, wherein the physical block address maps to a logical block address of the requested data, wherein reading the requested data from the non-volatile memory is based on the physical block address.

In some embodiments, suspending the ongoing write operation is in response to detecting a completion of an ongoing verify procedure in an incremental step pulse program.

In some embodiments, the system verifies the requested data read from the non-volatile memory, and transmits the verified data to a requesting host.

In some embodiments, the non-volatile memory may only be accessed by a single read or write operation at a time.

Another embodiment provides a system which facilitates a high-priority read. During operation, the system detects a new request to read first data from a non-volatile memory. The system suspends a write operation to write second data to the non-volatile memory. The system reads the first data from the non-volatile memory. The system resumes the suspended write operation.

BRIEF DESCRIPTION OF THE FIGURES

FIG. 2A illustrates an exemplary environment for handling a read operation during an ongoing write operation, in accordance with the prior art.

FIG. 2B illustrates an exemplary environment for handling a read operation during an ongoing write operation, in accordance with an embodiment of the present application.

In the figures, like reference numerals refer to the same figure elements.

DETAILED DESCRIPTION

Figure 1A:
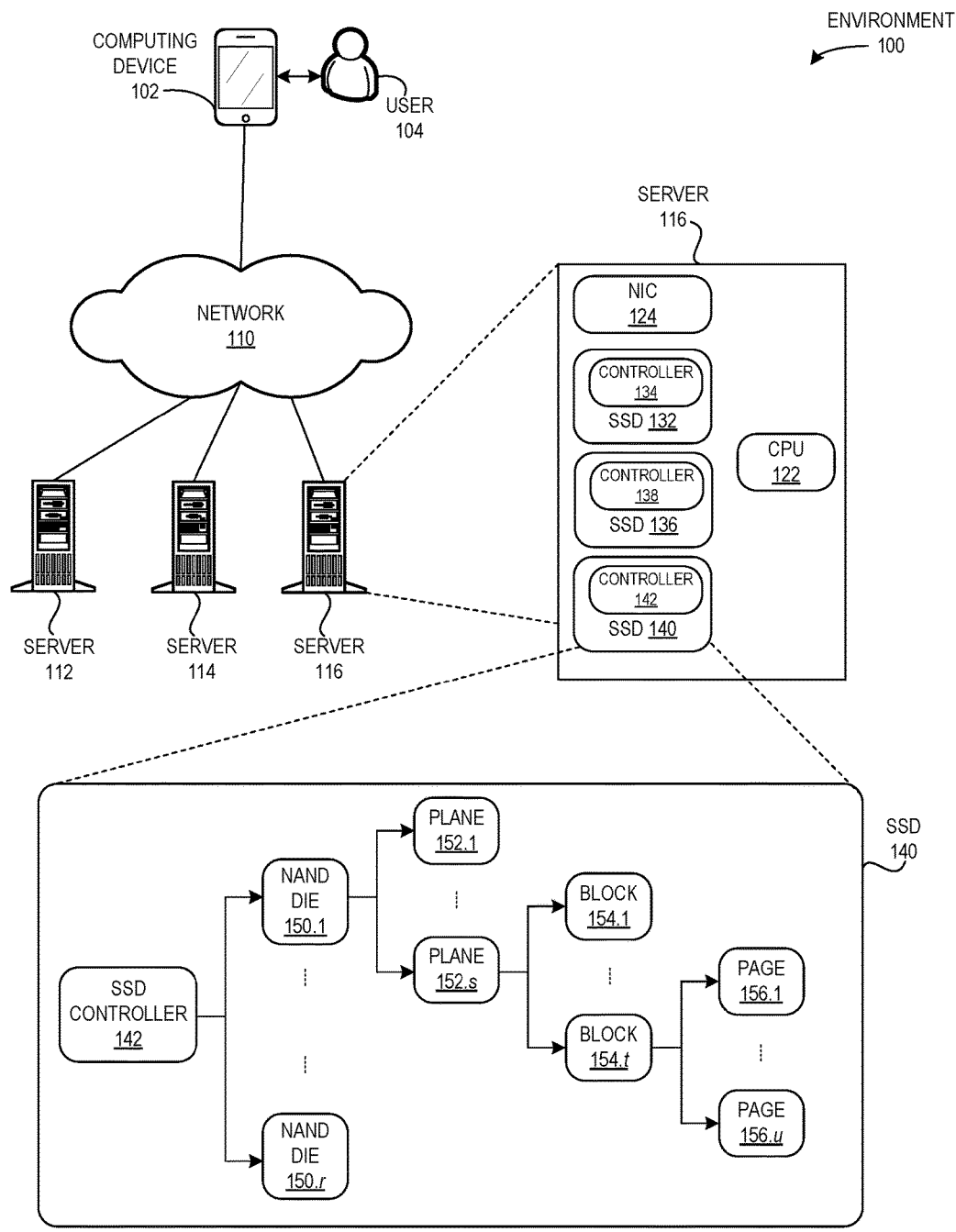
FIG. 1A illustrates an exemplary environment that facilitates a high-priority read, in accordance with an embodiment of the present application.

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the embodiments described herein are not limited to the embodiments shown, but are to be accorded the widest scope consistent with the principles and features disclosed herein.

Overview

The embodiments described herein solve the problem of facilitating a high-priority read operation on a NAND flash (e.g., a die) with an ongoing write operation by suspending the ongoing write operation, performing the read operation, and resuming the suspended write operation. Data is typically written to and read from a page on a single die, which has a single page buffer. During a write operation, the page buffer of the single die may be full, which prevents any other I/O operations from occurring on that die. That is, if a read operation is requested for the same die on which a write operation is currently being performed, the read operation must wait until the ongoing write operation is completed. Thus, the latency involved in performing the read operation on the die is dependent on completion of an ongoing write operation on the same die.

Writing data to a page may require approximately several milliseconds, while reading data from a page may require only hundreds of microseconds. Thus, a read operation results in a higher latency from a delayed start in waiting for completion of an ongoing write operation, where the delay may be on the order of milliseconds. Given both the increasing density of current NAND dies and the decreasing size of computer components in general, a read operation may result in a hit on the same NAND die on which an ongoing write operation is being performed, thus resulting in a higher latency. This higher latency can decrease the efficiency of a storage system.

The embodiments described herein address this inefficiency by providing a storage system which facilitates a high-priority read operation on a NAND flash (e.g., a die) with an ongoing write operation by suspending the ongoing write operation, performing the read operation, and resuming the suspended write operation. A storage system (e.g., a solid state drive or SSD) can include a controller and multiple non-volatile memory components (e.g., NAND flash components or NAND dies). When the system receives a high-priority read request, and the requested data resides on a die which is performing an ongoing write operation, the system can suspend the ongoing write operation, read the requested data, and resume the suspended write operation. Data to be written to and read from a die is stored in a page buffer of the die, while data from a suspended write operation is stored in a data buffer of the controller, as described below in relation to FIG. 3. The execution of an I/O operation (e.g., a high-priority read or an ongoing, suspended, or resume write operation) may be based on an incremental step pulse program, as described below in relation to FIG. 4.

Thus, the embodiments described herein provide a system which improves the efficiency of a storage system, where the improvements are fundamentally technological. The improved efficiency can include an improved performance in latency for completion of I/O tasks, as well as an improved Quality of Service (QoS) for performing read operations. The system provides a technological solution (i.e., a storage system which facilitates a high-priority read by suspending an ongoing write operation, performing the read, and resuming the suspended write operation, and further includes a controller which facilitates the high-priority read) to the technological problem of reducing latency in I/O tasks, improving the QoS, and improving the overall efficiency of the system.

The terms "storage server," "storage device," and "storage system" refer to a server, device, or system which can include multiple drives and multiple memory modules or components.

The term "drive" refers to a hard drive in a storage system, such as a solid state drive (SDD) or a hard disk drive (HDD).

The term "non-volatile memory" refers to long-term persistent computer storage, such as a NAND flash memory of an SSD. A NAND flash can include multiple dies, each die can include multiple planes, each plane can include multiple blocks, and each block can include multiple pages. A "die" can include a page buffer for temporary storage of data to be read from or written to the die. Data stored in the page buffer may timeout based on a timestamp for the stored data.

The terms "controller module" and "controller" refer to a module located in a storage server, and may be used interchangeably. In the embodiments described herein, the controller is situated in the drive between the non-volatile memory and a requesting host. The controller can include a data buffer, into which data is written for temporary storage, e.g., data associated with a suspended write operation. The controller's data buffer can also include data which is being processed by the controller, including encoded/decoded, compressed/decompressed, encrypted/decrypted, ECC-encoded/-decoded, formatted/re-formatted, and timestamped.

The term "ECC-encoding" refers to encoding data based on an error correction code, while the term "ECC-decoding" refers to decoding data based on the error correction code. An "ECC-encoder/decoder" is a module which performs ECC-encoding/decoding.

Exemplary Environment and General Exemplary Communication

FIG. 1A illustrates an exemplary environment 100 that facilitates a high-priority read, in accordance with an embodiment of the present application. Environment 100 can include a computing device 102 which is associated with a user 104. Computing device 102 can include, for example, a tablet, a mobile phone, an electronic reader, a laptop computer, a desktop computer, or any other computing device. Computing device 102 can communicate via a network 110 with servers 112, 114, and 116, which can be part of a distributed storage system. Servers 112-116 can include a storage server, which can a CPU, an interface card, and storage devices or modules. For example, server 116 can include a CPU 122, a network interface card (NIC) 124, and solid state drives (SSDs) 132, 136, and 140, where each SDD can have, respectively, its own controller 134, 138, and 142. Each SSD can include non-volatile memory, including multiple non-volatile memory modules or components. For example, SSD 140 can include NAND flash memory, including multiple NAND dies 150.1-150.r. A NAND die (e.g., NAND die 150.1) can include multiple planes 152.1-152.s. A plane (e.g., plane 152.s) can include multiple blocks 154.1-154.t. A block (e.g., block 154.t) can include multiple pages 156.1-156.u.

Data can be read from or written to a NAND die based on a page-level access. During operation, server 116 can receive a high-priority read request. If the requested data resides on a die which is performing an ongoing write operation (e.g., on NAND die 150.1, and specifically from page 156.1), the system can suspend the ongoing write operation, read the requested data (from page 156.1), and resume the suspended write operation.

Thus, server 116 depicts a high-level architecture for a system which facilitates a high-priority read operation on a non-volatile memory component which is currently performing a write operation. Data to be written to and read from a die is stored in a page buffer of the die, while data from a suspended write operation is stored in a data buffer of the controller, as described below in relation to FIG. 3.

Figure 1B:
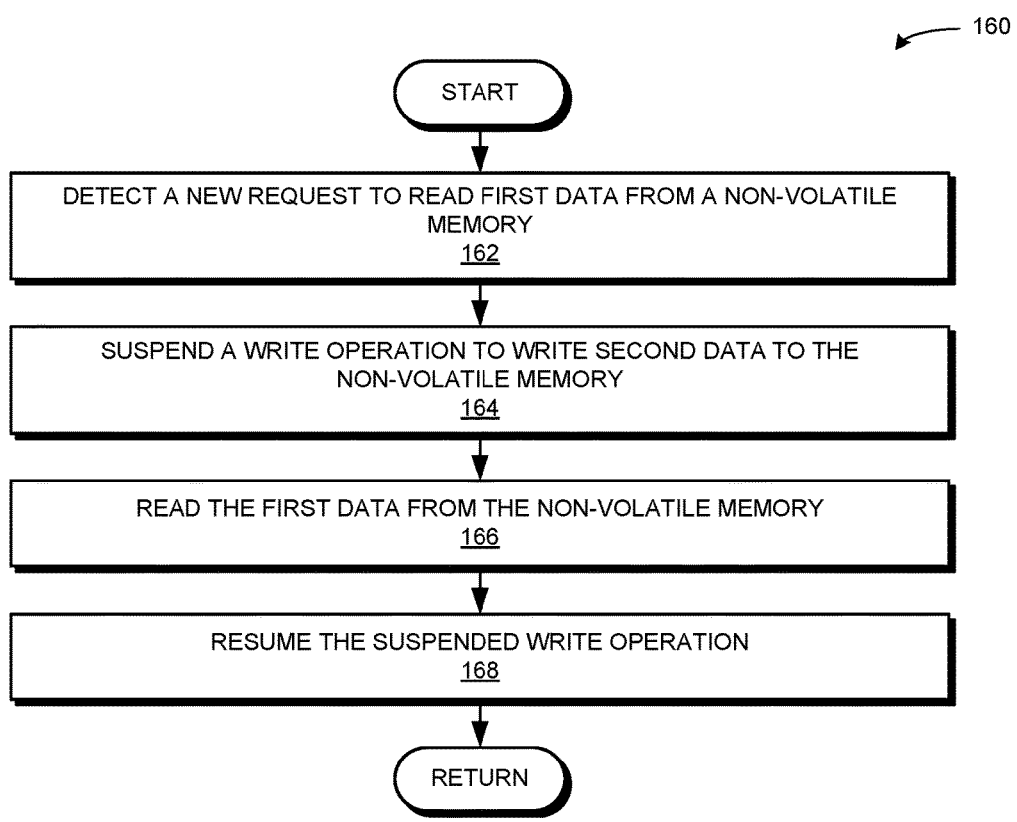
FIG. 1B presents a flowchart illustrating a method which facilitates a high-priority read, in accordance with an embodiment of the present application.

FIG. 1B presents a flowchart 160 illustrating a method which facilitates a high-priority read, in accordance with an embodiment of the present application. During operation, the system detects a new request to read first data from a non-volatile memory (operation 162). The system suspends a write operation to write second data to the non-volatile memory (operation 164). The system reads the first data from the non-volatile memory (operation 166). Subsequently, the system resumes the suspended write operation (operation 168).

A general data flow is described below in relation to FIGS. 2B and 3. An exemplary data flow in a read operation is described below in relation to FIG. 5, and an exemplary data flow in a write operation is described below in relation to FIGS. 6 and 7A-7C.

Exemplary Environment in the Prior Art Vs. Exemplary Embodiment

FIG. 2A illustrates an exemplary environment 200 for handling a read operation during an ongoing write operation, in accordance with the prior art. Environment 200 can include multiple pages which are performing ongoing write operations, which are represented over a time 202. For example: page 210.1 can be executing write operations 212.1 and 214.1; page 210.2 can be executing write operations 212.2 and 214.2; page 210.9 can be executing write operations 212.9 and 214.9; and page 210.10 can be executing write operations 212.10 and 214.10. Note that while environment 200 depicts only 10 pages of a non-volatile memory module, a non-volatile memory module may include many more pages.

Assume that the write operations 212.1-212.10 and 214.1-214.10 are performed in a sequential manner. At a time 204, the NAND memory may receive a read request 220, for data which is to be read from page 210.9. However, page 210.9 is currently in the middle of write operation 214.9. In a traditional read operation to access a NAND die with an ongoing write operation, the read operation must wait for the ongoing write operation to complete before it is performed. Thus, read operation 222 can only be performed after execution of write operation 214.9, such that a complete read request 224 may only occur at a time 206. This is because the page buffer for a single NAND die can only hold a certain amount of information at a page-level unit. As a result, a high latency may occur between time 204 and time 206. The latency can decrease the efficiency of a storage system.

FIG. 2B illustrates an exemplary environment 230 for handling a read operation during an ongoing write operation, in accordance with an embodiment of the present application. Environment 230 includes the same pages and write operations as environment 200. However, in environment 230, at a time 234, the NAND memory may receive a read request 240, for data which is to be read from page 210.9. Although page 210.9 is currently in the middle of write operation 214.9, the system can suspend write operation 214.9 (whereby a portion 214.9a has been written to page 210.9) and perform a read operation 242. At a time 236, upon a complete read request 244, the system can resume the suspended write operation 214.9 (whereby the remaining portion 214.9b can be written to page 210.9). The latency which occurs between time 233 and time 236 can be significantly lower than the latency which occurs between time 204 and time 206 in the prior art as depicted in environment 200.

Thus, embodiments of the present invention provide a system which decreases the latency in performing a read operation. The read operation may be associated with a high-priority read, which can be based on a set of predetermined conditions configured by the user or the system. Furthermore, by decreasing the latency of these read operations, the system can provide an improved QoS and also mitigate the write amplification involved in writing data to non-volatile memory at a page-level access.

Exemplary Communication for Facilitating a High-Priority Read

Figure 3:
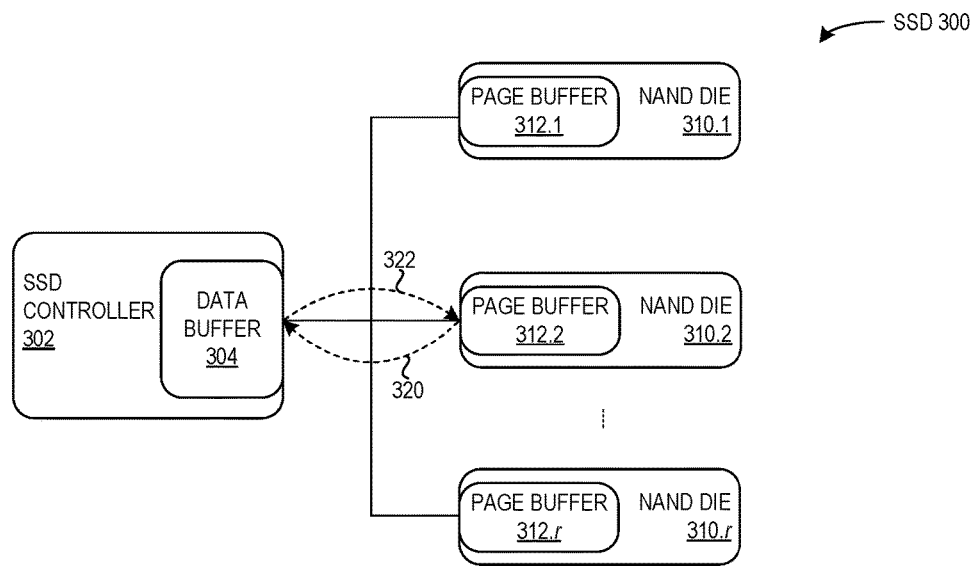
FIG. 3 illustrates exemplary communication between an SSD controller and a NAND die for facilitating a high-priority read, in accordance with an embodiment of the present application.

FIG. 3 illustrates exemplary communication in an SSD 300 between an SSD controller 302 and a NAND die 310.2 for facilitating a high-priority read, in accordance with an embodiment of the present application. SSD 300 can include SSD controller 302, which includes a data buffer 304. SSD 300 can also include multiple NAND dies 310.1-310.$r$, which can each include, respectively, page buffers 312.1-312.$r$. When a high-priority read operation is received for a specific die, and an ongoing write operation in the specific die is suspended, the data that is being written to the specific die is moved from the non-volatile memory to the controller. For example, the data being written is moved from a page buffer 312.2 of NAND die 310.2 to a data buffer 304 of SSD controller 302 in a communication 320. Data buffer 304 can be supported by a power loss protection. Thus, data that is stored in data buffer 304 will not be lost during a loss in power or a power failure because SSD 300 itself can provide sufficient charge or power for writing the data into NAND die 310.2 (or another NAND die if NAND die 310.2 becomes unavailable, as described below in relation to FIGS. 7A and 8). When the high-priority read operation is complete, the suspended write operation is resumed at the same physical page. The remaining data to be written is moved from data buffer 304 back to page buffer 312.2 in a communication 322. Instead of resuming from an erase program state, the write operation resumes from the state of the program upon initially suspending the write operation. A detailed description of resuming the write operation is described below in relation to FIG. 4.

Figure 4:
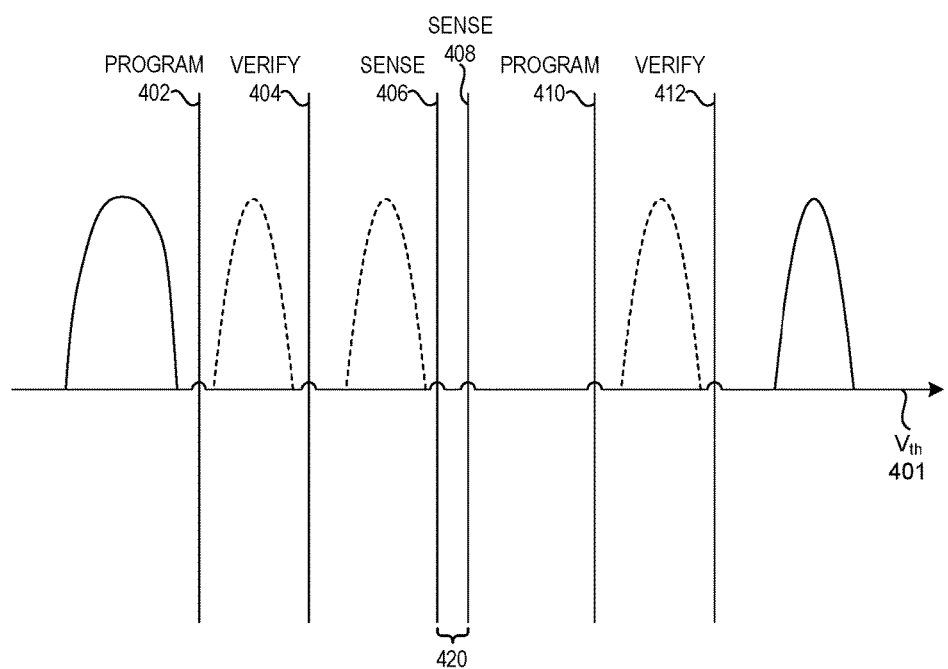
FIG. 4 illustrates an exemplary threshold voltage in an incremental step pulse program for facilitating a high-priority read, in accordance with an embodiment of the present application.

FIG. 4 illustrates an exemplary threshold voltage distribution 400 in an incremental step pulse program (ISPP) for facilitating a high-priority read, in accordance with an embodiment of the present application. Distribution 400 includes a voltage threshold ($V_{th}$) 401, and various procedures in an incremental step pulse program (ISPP). An ISPP can be used to maintain a tight cell threshold voltage distribution for high reliability. In general, ISPP uses a "program and verify" strategy, which involves repeating program and verify cycles on the cells of a flash memory. For example, distribution 400 illustrates the threshold voltage moving from the erase state (indicated by a program 402 with a wider distribution) to a verify 404, and a sense 406, which occurs when the program is suspended in order to perform to a high-priority read (indicated by a program ceased 420). When the program is resumed after the read is completed, the system performs a sense 408, and then proceeds as before with a program 410 and a verify 412, etc.

In the embodiments described herein, ISPP is used in a modified manner by including a sense operation both upon: a) suspending an ongoing write operation and starting a high-priority read operation (sense 406); and b) completing the high-priority read operation and resuming the suspended write operation (sense 408). While some ISPP-based programs include cycles of program, verify, and sense, the embodiments described herein insert an additional sense (i.e., sense 408), to determine the current threshold voltage of the cell. This additional sense procedure may alleviate issues from potential cross-talking or affected previous sense procedures based on the coupling effect of neighboring cells. Thus, by inserting additional sense 408 upon completion of the high-priority read, the system can provide an improved functioning for operation of the flash memory.

Exemplary Communication During a Read Operation

Figure 5:
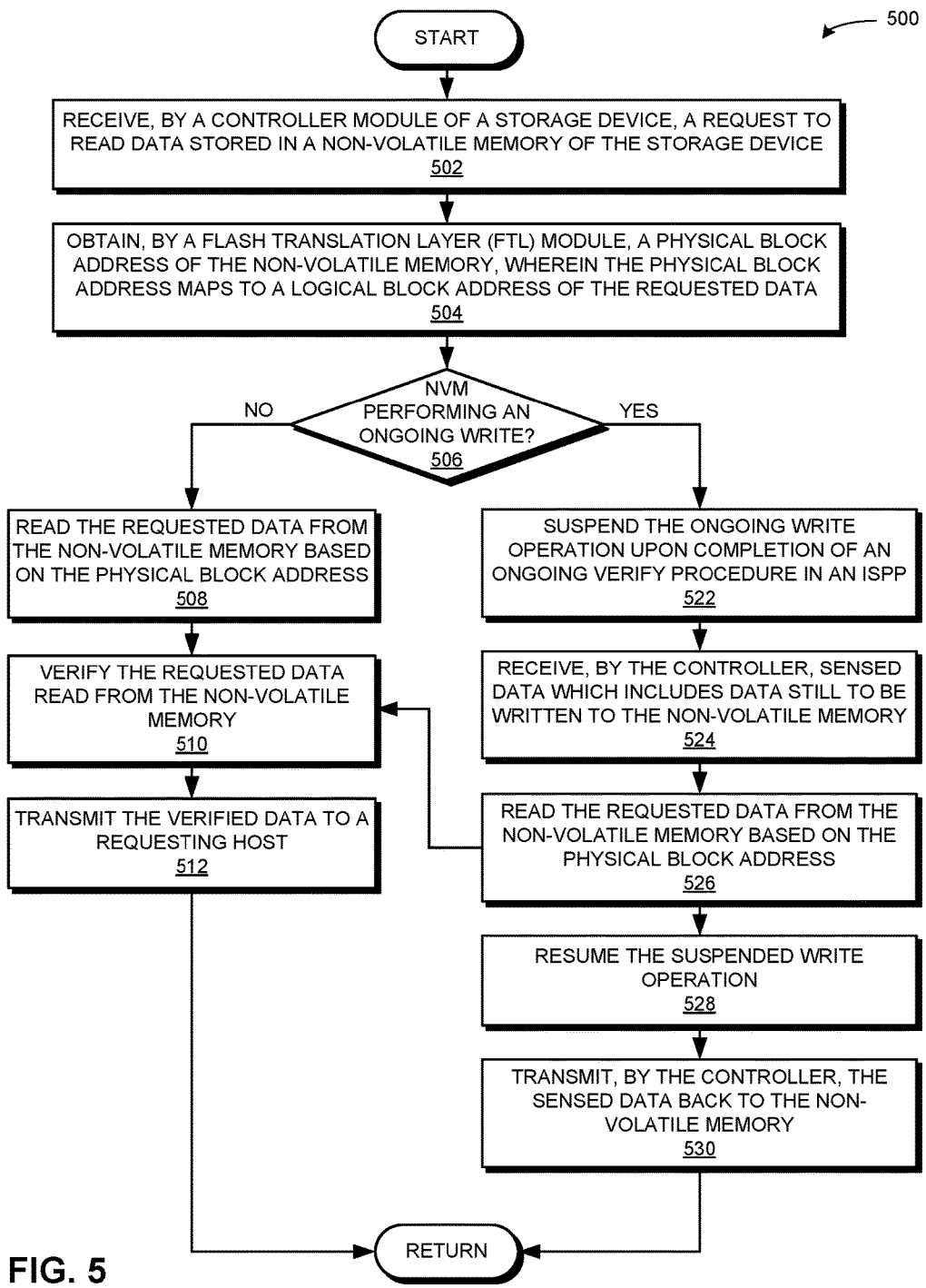
FIG. 5 presents a flowchart illustrating a method for reading data in a system which facilitates a high-priority read, in accordance with an embodiment of the present application.

FIG. 5 presents a flowchart 500 illustrating a method 500 for reading data in a system which facilitates a high-priority read, in accordance with an embodiment of the present application. During operation, the system receives, by a controller module of a storage device, a request to read data stored in a non-volatile memory of the storage device (operation 502). The system obtains, by a flash translation layer (FTL) module, a physical block address (PBA) of the non-volatile memory, wherein the physical block address maps to a logical block address for the requested data (operation 504). If the non-volatile memory is not performing an ongoing write operation (decision 506), the system reads the requested data from the non-volatile memory based on the physical block address (operation 508). The system verifies the requested data read from the non-volatile memory (operation 510), and transmits the verified data to a requesting host (operation 512).

If the non-volatile memory is performing an ongoing write operation (decision 506), the system suspends the ongoing write operation upon detecting completion of an ongoing verify procedure in an incremental step pulse program (ISPP) (operation 522). The system receives, by the controller, sensed data which includes data still to be written to the non-volatile memory (operation 524). The system reads the requested data from the non-volatile memory based on the physical block address (operation 526), and the operation continues as described above at operation 510 and also at operation 528. The system resumes the suspended write operation (operation 528). The system transmits, by the controller, the sensed data back to the non-volatile memory (operation 530).

Exemplary Communication During a Write Operation

Figure 6:
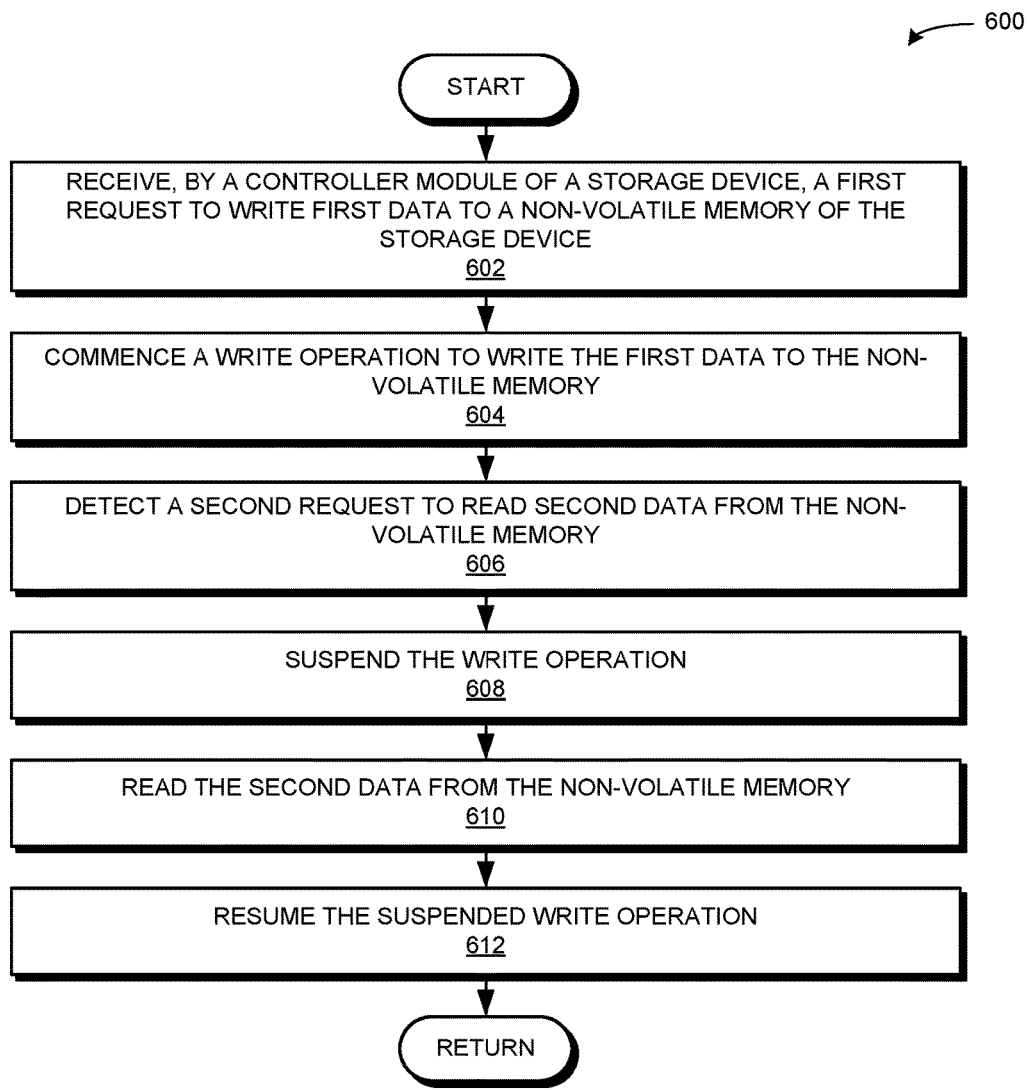
FIG. 6 presents a flowchart illustrating a method for writing data in a system which facilitates a high-priority read, in accordance with an embodiment of the present application.

FIG. 6 presents a flowchart 600 illustrating a method for writing data in a system which facilitates a high-priority read, in accordance with an embodiment of the present application. During operation, the system receives, by a controller module of a storage device, a first request to write first data to a non-volatile memory of the storage device (operation 602). The system commences a write operation to write the first data to the non-volatile memory (operation 604). The system detects a second request to read second data from the non-volatile memory (operation 606). The system suspends the write operation (operation 608), reads the second data from the non-volatile memory (operation 610), and resumes the suspended write operation (operation 612).

Figure 7A:
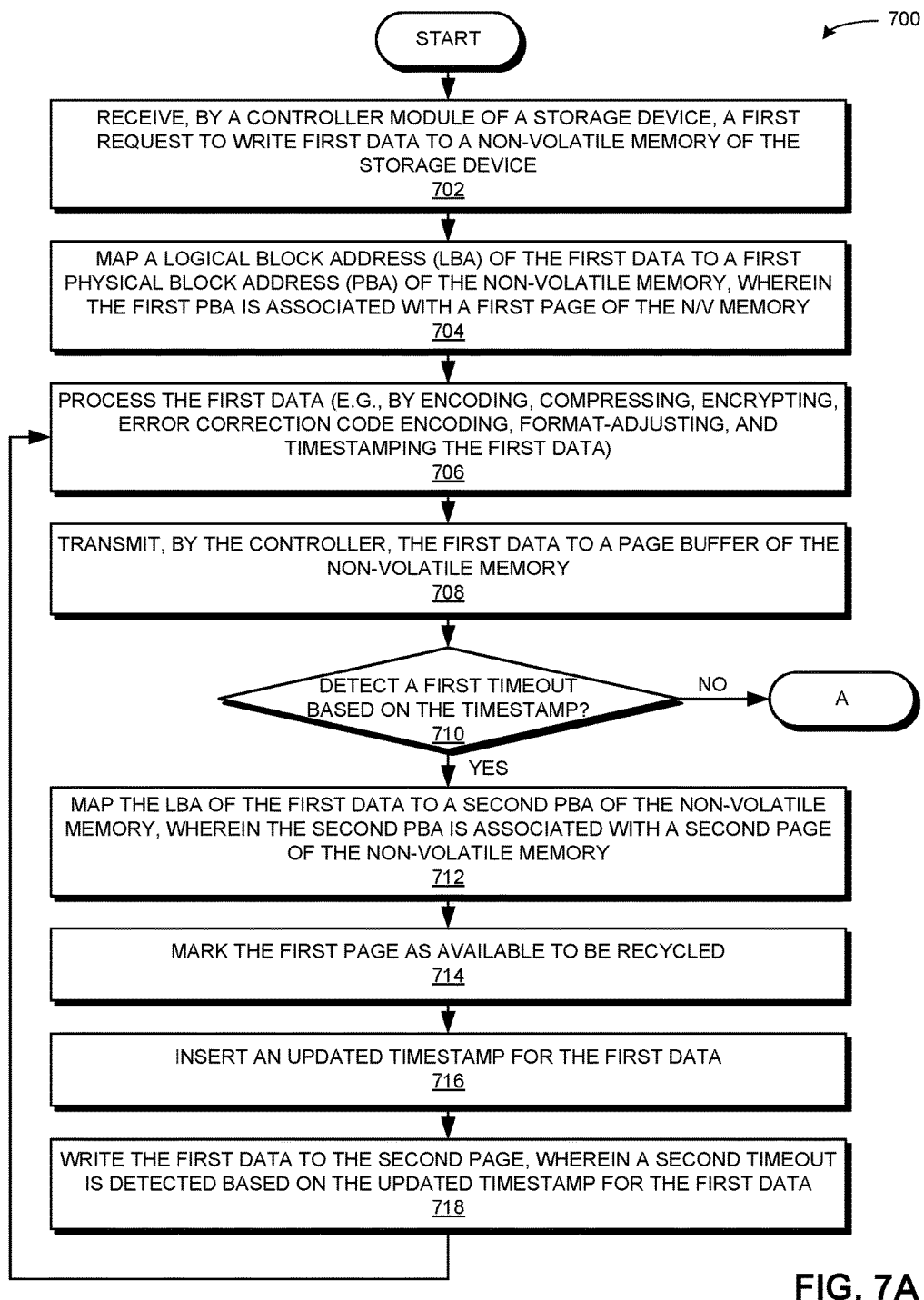
FIG. 7A presents a flowchart illustrating a method for writing data in a system which facilitates a high-priority read, in accordance with an embodiment of the present application.

FIG. 7A presents a flowchart 700 illustrating a method for writing data in a system which facilitates a high-priority read, in accordance with an embodiment of the present application. During operation, the system receives, by a controller module of a storage device, a first request to write first data to a non-volatile memory of the storage device (operation 702). The system maps a logical block address (LBA) of the first data to a first physical block address (PBA) of the non-volatile memory, wherein the first PBA is associated with a first page of the non-volatile memory (operation 704). The system processes the first data (e.g., by encoding, compressing, encrypting, error correction code encoding, format-adjusting, and timestamping the first data) (operation 706). The system transmits, by the controller, the first data to a page buffer of the non-volatile memory (operation 708). If the system does not detect a first timeout based on the timestamp for the first data (decision 710), the operation continues as described at Label A of FIG. 7B.

If the system does detect a first timeout based on the timestamp for the first data (decision 710), the system maps the logical block address of the first data to a second physical block address of the non-volatile memory, wherein the second physical block address is associated with a second page of the non-volatile memory (operation 712). Note that decision 710 can also include detecting a condition that makes the first page unavailable, such as a timeout of the data being written, a failure of the page being written to, or any other reason which results in the page or die being unavailable. This allows the system to avoid using an unavailable non-volatile memory or NAND die. The system marks the first page as available to be recycled (operation 714) (e.g., available for a garbage collection process), and inserts an updated timestamp for the first data (operation 716). The system writes the first data to the second page, wherein a second timeout is detected based on the updated timestamp for the first data (operation 718). The operation continues as described at operation 706.

Figure 7B:
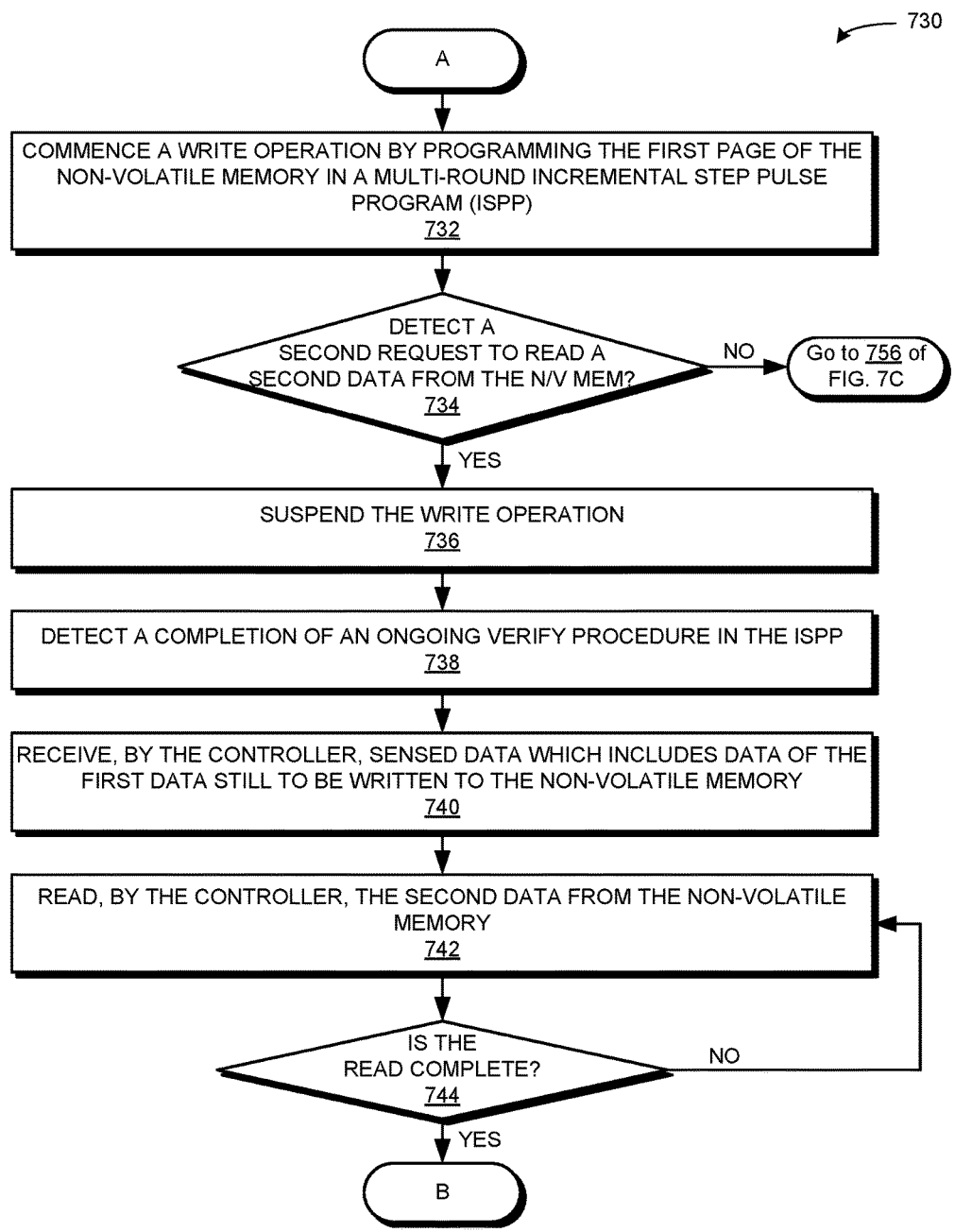
FIG. 7B presents a flowchart illustrating a method for writing data in a system which facilitates a high-priority read, in accordance with an embodiment of the present application.

FIG. 7B presents a flowchart 730 illustrating a method for writing data in a system which facilitates a high-priority read, in accordance with an embodiment of the present application. During operation, the system commences a write operation by programming the first page of the non-volatile memory in a multi-round incremental step pulse program (ISPP) (operation 732). If the system does not detect a second request to read a second data from the non-volatile memory (decision 734), the operation continues as depicted at operation 756 of FIG. 7C.

If the system does detect a second request to read a second data from the non-volatile memory (decision 734), the system suspends the write operation (operation 736). The second request can be detected as a high-priority read, or as a "read-pause" (i.e., a read operation which causes a pause of an ongoing write). The system detects a completion of an ongoing verify procedure in the ISPP (operation 738). The system receives, by the controller, sensed data which includes data of the first data still to be written to the non-volatile memory (operation 740). The system reads, by the controller, the second data from the non-volatile memory (operation 742). If the read operation is not complete (decision 744), the operation continues at operation 742. If the read operation is complete, the operation continues at Label B of FIG. 7C.

Figure 7C:
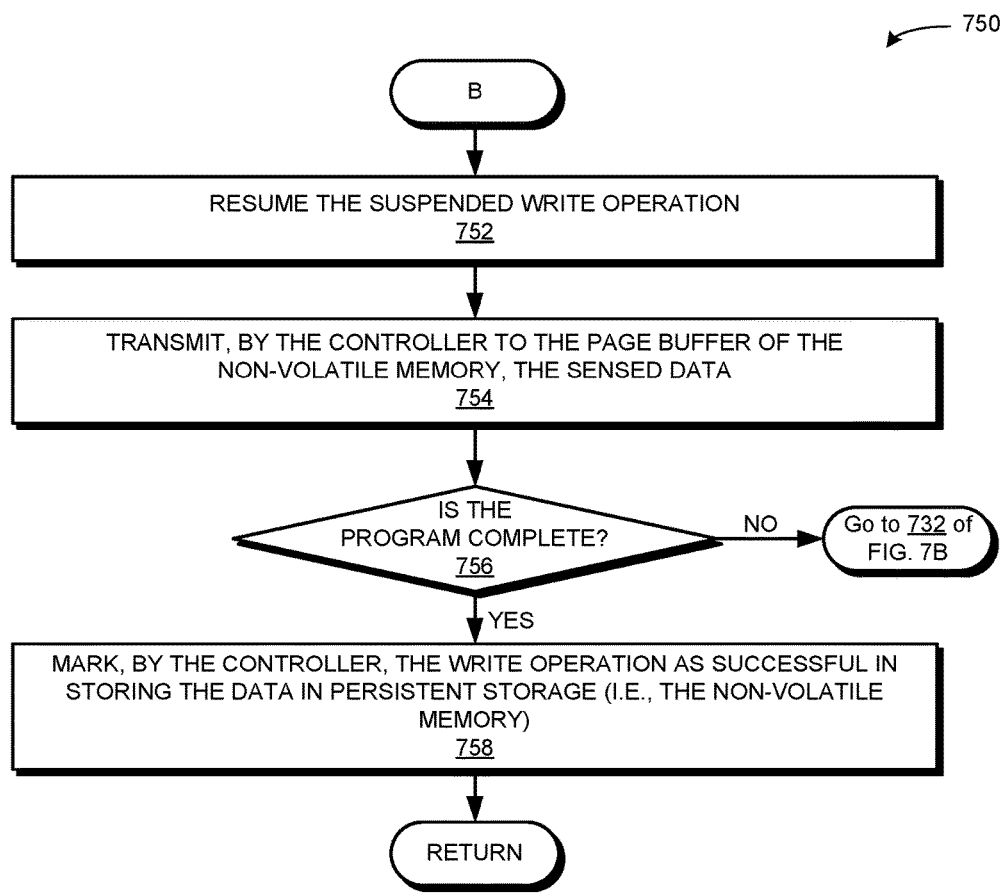
FIG. 7C presents a flowchart illustrating a method for writing data in a system which facilitates a high-priority read, in accordance with an embodiment of the present application.

FIG. 7C presents a flowchart 750 illustrating a method for writing data in a system which facilitates a high-priority read, in accordance with an embodiment of the present application. During operation, the system resumes the suspended write operation (operation 752). The system transmits, by the controller to the page buffer of the non-volatile memory, the sensed data (operation 754). If the program (i.e., the write operation) is not complete, the system continues at operation 732 of FIG. 7B. If the program is complete, the system marks, by the controller, the write operation as successfully storing the data in persistent storage (i.e., the non-volatile memory) (operation 758).

Remapping a Write Operation Given a Timeout or an Unavailable Die

Figure 8:
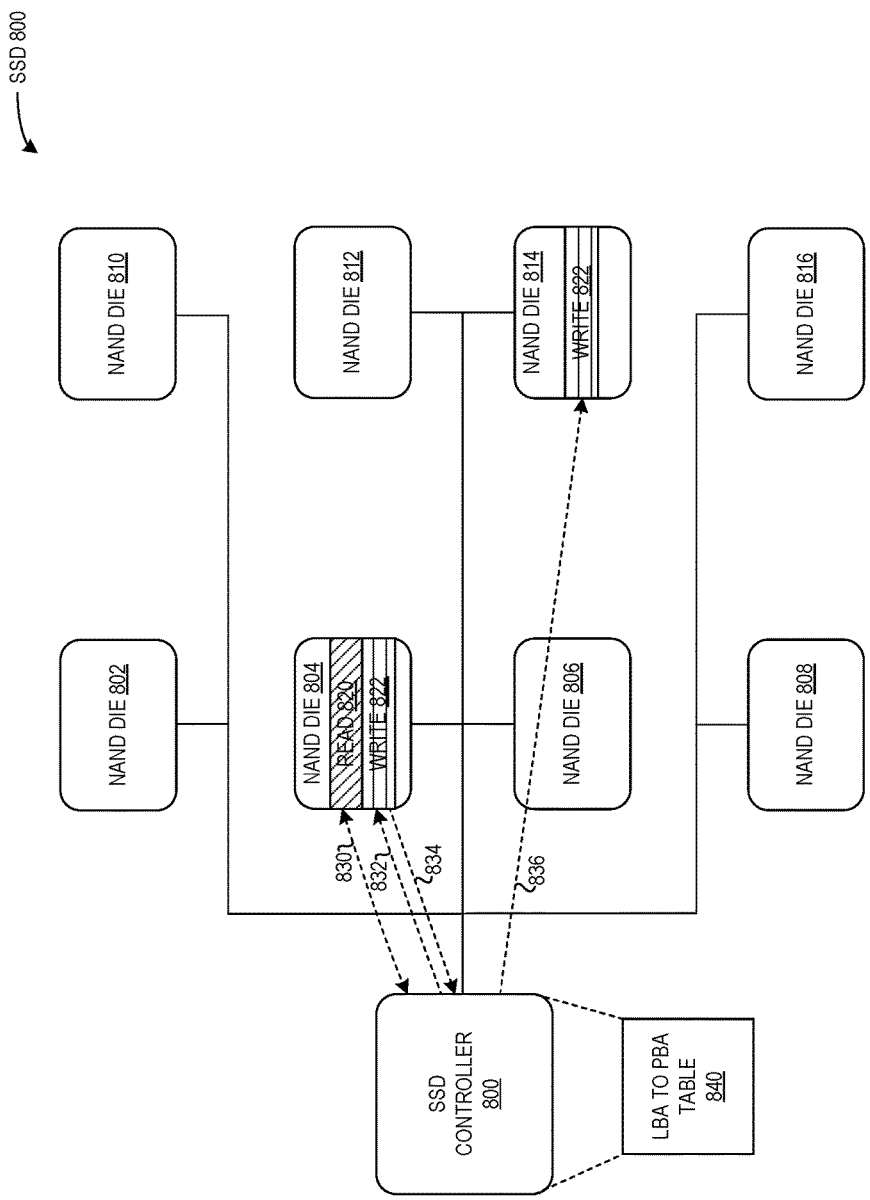
FIG. 8 presents exemplary communication for remapping a write operation, which facilitates a high-priority read, in accordance with an embodiment of the present application.

FIG. 8 presents exemplary communication in an SSD 800 for remapping a write operation, which facilitates a high-priority read, in accordance with an embodiment of the present application. SSD 800 can include an SSD controller 800, which can include or interact with an LBA to PBA mapping table 840. SSD 800 can also include multiple NAND dies 802-816, with which SSD controller can communicate. NAND die 804 can commence performing a write operation 822 (communication 832). SSD controller may determine to insert a high-priority read operation during the ongoing write operation, in which case the data to be written is moved from a page buffer of NAND die 804 to a data buffer of controller 800 (communication 834), as depicted above in relation to FIG. 3. SSD controller can then send the read request to NAND die 804, which performs the requested read operation 820, and sends back the requested data (communications 830). SSD controller 300 can detect a condition which triggers a remapping of the write operation. That is, the system can map the logical block address of the data to be written to an updated physical block address. The triggering condition can include: detecting a timeout of the data to be written, based on a timestamp for the data; an unavailability of the affected page of the non-volatile memory (e.g., a page of NAND die 804); a failure of the affected page to which the data is being written (e.g., a page of NAND die 804); and any other reason which results in the page or die being unavailable.

After remapping the LBA to the updated PBA, the system marks the affected page as available to be recycled (e.g., available for a garbage collection process), updates the timestamp for the data, and writes the data to a new page associated with the updated physical block address (communication 836).

Exemplary Computer System and Apparatus

Figure 9:
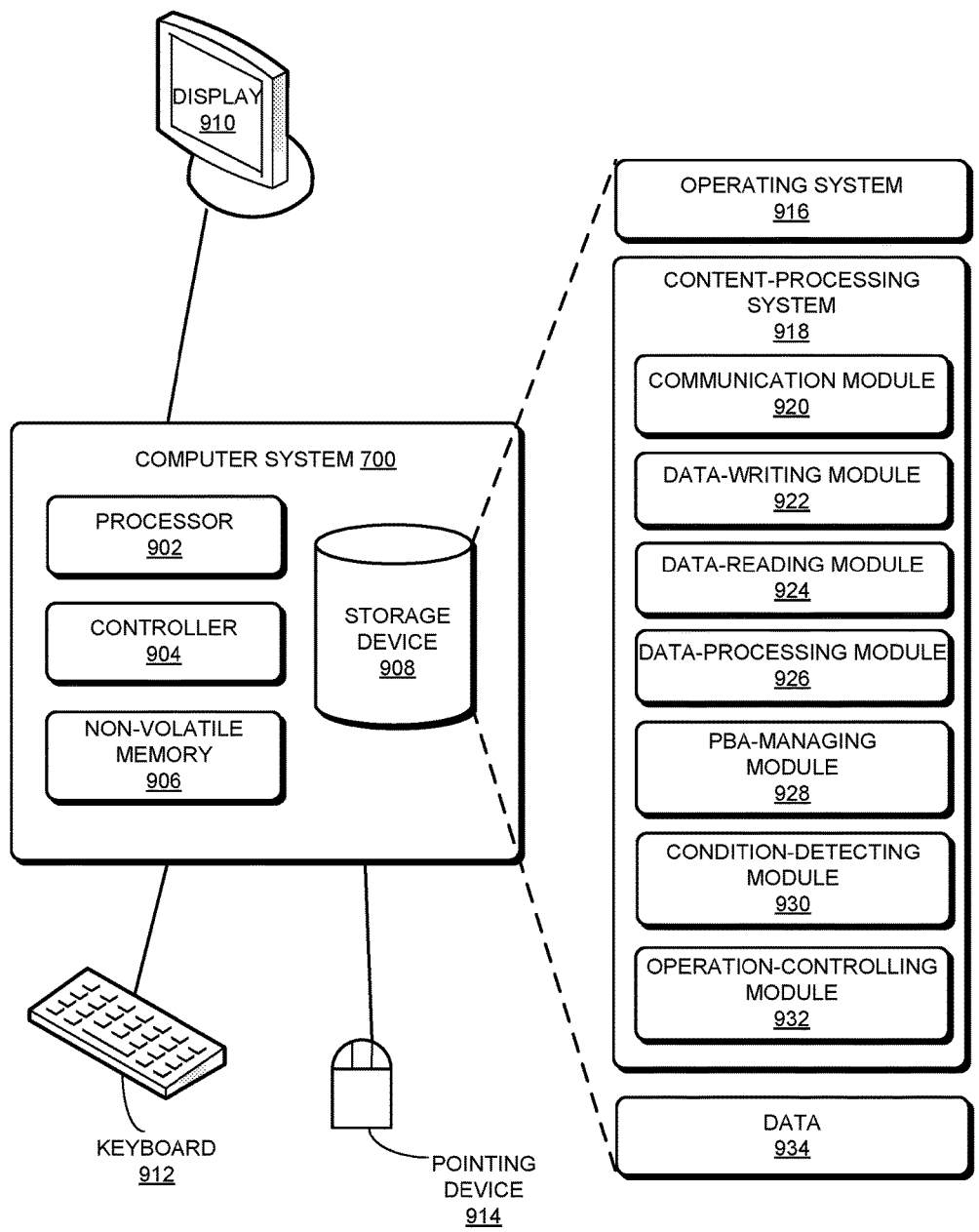
FIG. 9 illustrates an exemplary computer system that facilitates a high-priority read, in accordance with an embodiment of the present application.

FIG. 9 illustrates an exemplary computer system 900 that facilitates a high-priority read, in accordance with an embodiment of the present application. Computer system 900 includes a processor 902, a controller 904, a non-volatile memory 906, and a storage device 908. Computer system 900 may be a client-serving machine. Computer system 900 can also include volatile memory (not shown), which can include, e.g., RAM, that serves as a managed memory, and can be used to store one or more memory pools. Non-volatile memory 906 can include persistent storage that is accessed via controller 904. Furthermore, computer system 900 can be coupled to a display device 910, a keyboard 912, and a pointing device 914. Storage device 908 can store an operating system 916, a content-processing system 918, and data 934.

Content-processing system 918 can include instructions, which when executed by computer system 900, can cause computer system 900 to perform methods and/or processes described in this disclosure. Specifically, content-processing system 918 can include instructions for receiving and transmitting data packets, including a request to write or read data, and data to be processed (e.g., encoded, encrypted, compressed, adjusted, timestamped) and stored. Content-processing system 918 can further include instructions for receiving, by a controller module of a storage device, a first request to write first data to a non-volatile memory of the storage device (communication module 920). Content-processing system 918 can include instructions for commencing a write operation to write the first data to the non-volatile memory (data-writing module 922). Content-processing system 918 can include instructions for, in response to detecting a second request to read second data from the non-volatile memory (communication module 920): suspending the write operation (operation-controlling module 932); reading the second data from the non-volatile memory (data-reading module 924); and resuming the suspended write operation (operation-controlling module 932).

Content-processing system 918 can include instructions for mapping a logical block address of the first data to a first physical block address of the non-volatile memory (PBA-managing module 928). Content-processing system 918 can include instructions for, in response to detecting a first timeout based on a timestamp for the first data (condition-detecting module 930): mapping the logical block address of the first data to a second physical block address of the non-volatile memory (PBA-managing module 928); marking the first page as available to be recycled (data-processing module 926); updating the timestamp for the first data (data-processing module 926); and writing the first data to the second page (data-writing module 922).

Content-processing system 918 can include instructions for receiving, by a controller module of a storage device, a request to read data stored in a non-volatile memory of the storage device (communication module 920). Content-processing system 918 can include instructions for, in response to determining that the non-volatile memory is performing an ongoing write operation (condition-detecting module 930): suspending the ongoing write operation (operation-controlling module 932); reading the requested data from the non-volatile memory (data-reading module 924); and resuming the suspended write operation (operation-controlling module 932).

Data 934 can include any data that is required as input or that is generated as output by the methods and/or processes described in this disclosure. Specifically, data 934 can store at least: a request to read or write data; data to be written, read, stored, or accessed; processed or stored data; encoded or decoded data; encrypted or compressed data; decrypted or decompressed data; an error correction code (ECC) encoding or decoding; an indicator of a suspended write operation; a logical block address; a physical block address; a data buffer; a page buffer; a timestamp; a timeout; a condition; sensed data; an incremental step pulse program (ISPP); any procedure in an ISPP; and an indicator of data being ready to be recycled.

Figure 10:
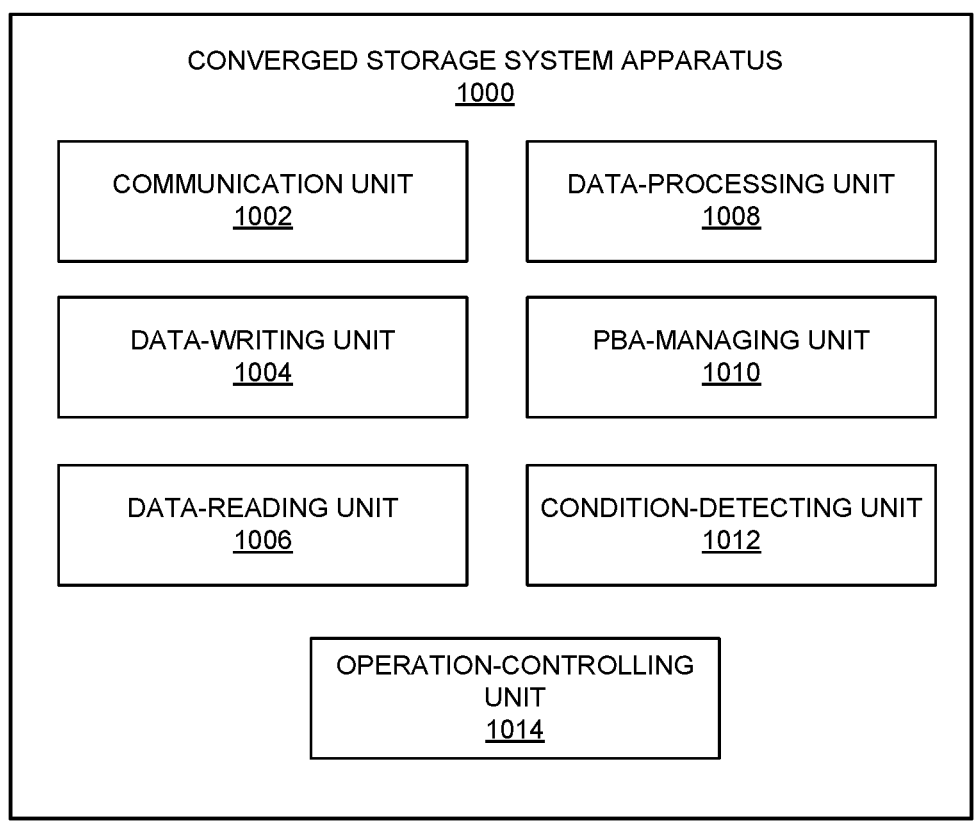
FIG. 10 illustrates an exemplary apparatus that facilitates a high-priority read, in accordance with an embodiment of the present application.

FIG. 10 illustrates an exemplary apparatus 1000 that facilitates a high-priority read, in accordance with an embodiment of the present application. Apparatus 1000 can comprise a plurality of units or apparatuses which may communicate with one another via a wired, wireless, quantum light, or electrical communication channel. Apparatus 1000 may be realized using one or more integrated circuits, and may include fewer or more units or apparatuses than those shown in FIG. 10. Further, apparatus 1000 may be integrated in a computer system, or realized as a separate device which is capable of communicating with other computer systems and/or devices. Specifically, apparatus 1000 can comprise units 1002-1014 which perform functions or operations similar to modules 920-932 of computer system 900 of FIG. 9, including: a communication unit 1002; a data-writing unit 1004; a data-reading unit 1006; a data-processing unit 1008; a PBA-managing unit 1010; a condition-detecting unit 1012; and an operation-controlling unit 1014.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described above can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

The foregoing embodiments described herein have been presented for purposes of illustration and description only. They are not intended to be exhaustive or to limit the embodiments described herein to the forms disclosed. Accordingly, many modifications and variations will be apparent to practitioners skilled in the art. Additionally, the above disclosure is not intended to limit the embodiments described herein. The scope of the embodiments described herein is defined by the appended claims.

What is claimed is:

1. A computer-implemented method for facilitating a high-priority read, the method comprising:
   receiving, by a controller module of a storage device, a first request to write first data to a non-volatile memory of the storage device;
   commencing a write operation to write the first data to a first page of the non-volatile memory;
   detecting a condition which triggers a remapping of the write operation;
   writing the first data to a second page of the non-volatile memory; and
   in response to receiving a second request to read second data from the second page of the non-volatile memory:
      suspending the write operation;
      receiving, by the controller module, sensed data which includes data of the first data still to be written to the second page of the non-volatile memory;
      storing, by the controller module, the sensed data in a data buffer of the controller;
      reading the second data from the second page of the non-volatile memory; and
      in response to successfully reading the second data from the second page of the non-volatile memory, resuming the suspended write operation by transmitting the sensed data to the non-volatile memory.

2. The method of claim 1, further comprising:
   mapping a logical block address of the first data to a first physical block address of the non-volatile memory,
   wherein the first physical block address is associated with the first page of the non-volatile memory.

3. The method of claim 2, wherein in response to detecting the condition which triggers a remapping of the write operation, the method further comprises:
   detecting a first timeout based on a timestamp for the first data;
   mapping the logical block address of the first data to a second physical block address of the non-volatile memory,
   wherein the second physical block address is associated with the second page of the non-volatile memory;
   marking the first page as available to be recycled;
   updating the timestamp for the first data; and
   writing the first data to the second page, wherein a second timeout is detected based on the updated timestamp for the first data.

4. The method of claim 1, further comprising processing the first data by:
- encoding the first data based on a cyclic redundancy check;
- further processing the first data by compressing and encrypting the encoded data;
- encoding the further processed data based on an error correction code (ECC);
- adjusting a format of the ECC-encoded data; and
- inserting a timestamp for the adjusted data.

5. The method of claim 1, further comprising:
- in response to completing, by an incremental step pulse program, an ongoing verify procedure, suspending the write operation;
- performing, by the incremental step pulse program, a first sense procedure in response to suspending the write operation and reading the second data; and
- performing, by the incremental step pulse program, a second sense procedure in response to successfully reading the second data and resuming the suspended write operation.

6. The method of claim 1, wherein detecting the condition which triggers the remapping of the write operation is based on one or more of:
- a condition which makes the first page unavailable;
- a timeout of the first data to be written;
- a failure of the first page; and
- a failure of a die or other physical component associated with the first page.

7. The method of claim 1, wherein the non-volatile memory is a NAND flash memory which includes a plurality of dies, wherein a die includes a plurality of planes, wherein a plane includes a plurality of blocks, wherein a block includes a plurality of pages, and
- wherein the non-volatile memory may only be accessed by a single read or write operation at a time.

8. A computer-implemented method for facilitating a high-priority read, the method comprising:
- receiving, by a controller module of a storage device, a request to write first data to a non-volatile memory;
- commencing a write operation to write the first data to a first page of the non-volatile memory;
- detecting a condition which triggers a remapping of the write operation;
- writing the first data to a second page of the non-volatile memory;
- receiving, by the controller module, a request to read second data stored in the second page of the non-volatile memory of the storage device; and
- in response to determining that the non-volatile memory is performing an ongoing write operation of the first data to the second page of the non-volatile memory:
- suspending the ongoing write operation;
- receiving, by the controller module, sensed data which includes data of the first data still to be written to the second page of the non-volatile memory;
- storing, by the controller module, the sensed data in a data buffer of the controller;
- reading the requested second data from the second page of the non-volatile memory; and
- in response to successfully reading the second data from the second page of the non-volatile memory, resuming the suspended write operation by transmitting the sensed data to the non-volatile memory.

9. The method of claim 8, further comprising:
- obtaining a physical block address of the non-volatile memory, wherein the physical block address maps to a logical block address of the requested second data,
- wherein reading the requested second data from the non-volatile memory is based on the physical block address.

10. The method of claim 8, further comprising:
- in response to completing, by an incremental step pulse program, an ongoing verify procedure, suspending the ongoing write operation;
- performing, by the incremental step pulse program, a first sense procedure in response to suspending the ongoing write operation and reading the second data; and
- performing, by the incremental step pulse program, a second sense procedure in response to successfully reading the second data and resuming the suspended write operation.

11. The method of claim 8, further comprising:
- verifying the requested second data read from the non-volatile memory; and
- transmitting the verified data to a requesting host.

12. The method of claim 8, wherein the non-volatile memory may only be accessed by a single read or write operation at a time.

13. A computer system for facilitating a high-priority read, the system comprising:
- a processor; and
- a memory coupled to the processor and storing instructions, which when executed by the processor cause the processor to perform a method, the method comprising:
  - receiving, by a controller module of a storage device, a first request to write first data to a non-volatile memory of the storage device;
  - commencing a write operation to write the first data to a first page of the non-volatile memory;
  - detecting a condition which triggers a remapping of the write operation;
  - writing the first data to a second page of the non-volatile memory; and
  - in response to receiving a second request to read second data from the second page of the non-volatile memory:
    - suspending the write operation;
    - receiving, by the controller module, sensed data which includes data of the first data still to be written to the second page of the non-volatile memory;
    - storing, by the controller module, the sensed data in a data buffer of the controller;
    - reading the second data from the second page of the non-volatile memory; and
    - in response to successfully reading the second data from the second page of the non-volatile memory, resuming the suspended write operation by transmitting the sensed data to the non-volatile memory.

14. The computer system of claim 13, wherein the method further comprises:
- mapping a logical block address of the first data to a first physical block address of the non-volatile memory,
- wherein the first physical block address is associated with the first page of the non-volatile memory.

15. The computer system of claim 14, wherein in response to detecting the condition which triggers a remapping of the write operation, the method further comprises:
- detecting a first timeout based on a timestamp for the first data;

mapping the logical block address of the first data to a second physical block address of the non-volatile memory,
wherein the second physical block address is associated with the second page of the non-volatile memory;
marking the first page as available to be recycled;
updating the timestamp for the first data; and
writing the first data to the second page, wherein a second timeout is detected based on the updated timestamp for the first data.

16. The computer system of claim 13, wherein the method further comprises processing the first data by:
encoding the first data based on a cyclic redundancy check;
further processing the first data by compressing and encrypting the encoded data;
encoding the further processed data based on an error correction code (ECC);
adjusting a format of the ECC-encoded data; and
inserting a timestamp for the adjusted data.

17. The computer system of claim 13, wherein the method further comprises:
in response to completing, by an incremental step pulse program, an ongoing verify procedure, suspending the write operation;
performing, by the incremental step pulse program, a first sense procedure in response to suspending the write operation and reading the second data; and
performing, by the incremental step pulse program, a second sense procedure in response to successfully reading the second data and resuming the suspended write operation.

18. The computer system of claim 13, wherein detecting the condition which triggers the remapping of the write operation is based on one or more of:
a condition which makes the first page unavailable;
a timeout of the first data to be written;
a failure of the first page; and
a failure of a die or other physical component associated with the first page.

19. The computer system of claim 13, wherein the non-volatile memory is a NAND flash memory which includes a plurality of dies, wherein a die includes a plurality of planes, wherein a plane includes a plurality of blocks, wherein a block includes a plurality of pages, and
wherein the non-volatile memory may only be accessed by a single read or write operation at a time.

20. A computer system for facilitating a high-priority read, the system comprising:
a processor; and
a memory coupled to the processor and storing instructions, which when executed by the processor cause the processor to perform a method, the method comprising:
receiving, by a controller module, a request to write first data to a non-volatile memory;
commencing a write operation to write the first data to a first page of the non-volatile memory;
detecting a condition which triggers a remapping of the write operation;
writing the first data to a second page of the non-volatile memory;
detecting a new request to read second data from the second page of the non-volatile memory;
in response to determining an ongoing write operation of the first data to the second page of the non-volatile memory:
suspending the ongoing write operation;
receiving, by the controller module, sensed data which includes data of the first data still to be written to the second page of the non-volatile memory;
storing, by the controller module, the sensed data in a data buffer of the controller;
reading the requested second data from the second page of the non-volatile memory; and
in response to successfully reading the second data from the second page of the non-volatile memory, resuming the suspended write operation by transmitting the sensed data to the non-volatile memory.

* * * * *